United States Patent [19]
Shiralagi et al.

[11] Patent Number: 5,591,666
[45] Date of Patent: Jan. 7, 1997

[54] SEMICONDUCTOR DEVICE AND METHOD OF FABRICATION

[75] Inventors: Kumar Shiralagi, Chandler; Raymond K. Tsui, Phoenix; Herbert Goronkin, Tempe, all of Ariz.

[73] Assignee: Motorola, Schaumburg, Ill.

[21] Appl. No.: 511,776

[22] Filed: Aug. 7, 1995

[51] Int. Cl.$^6$ .................................................. H01L 21/20
[52] U.S. Cl. .................... 437/103; 437/107; 437/126; 437/129; 437/133; 117/913; 117/923
[58] Field of Search .................................. 437/103, 107, 437/126, 129, 133; 117/923, 913

[56] References Cited

U.S. PATENT DOCUMENTS

| | | | |
|---|---|---|---|
| 5,013,682 | 5/1991 | Plumton et al. | 437/89 |
| 5,272,106 | 12/1993 | Hirtz et al. | 437/89 |
| 5,294,565 | 3/1994 | Shiraishi | 437/133 |
| 5,298,445 | 3/1994 | Asano | 437/133 |
| 5,345,097 | 9/1994 | Nakagawa | 437/133 |
| 5,429,957 | 7/1995 | Matsuno et al. | 437/133 |

OTHER PUBLICATIONS

Kenji Hiruma et al., "Selective Growth of Ultra–Low Resistance GaAs/InGaAs for High Performance InGaAs FETs", Journal of Crystal Growth 124 (1992) pp. 255–259.

M.F. Zybura et al., "High Selectivity Patterned Substrate Epitaxy of $In_xGa_{1-x}As/GaAs(0<X<1)$ by Conventional LPOMVPE", J. Electrochem. Soc., vol. 139, No. 9, Sep. 1992, The Electrochemical Society, Inc., pp. L84–L86.

*Primary Examiner*—Robert Kunemund
*Attorney, Agent, or Firm*—Eugene A. Parsons

[57] ABSTRACT

A method of fabricating semiconductor devices including defining an area on the surface of a substrate, selectively growing, on the area, a crystalline material with at least one defined crystallographic facet, and selectively growing a semiconductor device on the crystallographic facet. In a second embodiment, an area is defined on the surface of a substrate and chemical beam epitaxy is used to selectively grow, on the area, a layer of indium arsenide with at least one defined crystallographic facet.

20 Claims, 2 Drawing Sheets

SEMICONDUCTOR DEVICE AND METHOD OF FABRICATION

FIELD OF THE INVENTION

The present invention pertains to the fabrication of semiconductor devices and more specifically to improved fabrication methods that produce novel semiconductor devices.

BACKGROUND OF THE INVENTION

In the semiconductor field it is common to sequentially grow several different layers of semiconductor material and use various masks and etching steps to form the desired devices and terminals on the devices. In some methods, masking material. e.g. photoresist, dielectric layer, or the like, is applied and semiconductor material is grown over masked and unmasked areas. The material on the masked areas is then removed by etching and lift-off.

In each of these prior art methods of fabricating semiconductor devices, etching is required to remove unwanted material. During the etching process, the material of the semiconductor device has a high likelihood of being contaminated by the etchant, which contamination greatly reduces the life of the device, the operating characteristics of the device, and the reliability of the device. Also, various layers of the semiconductor devices have different etch rates, so that the etching process is very nonuniform. Further, the etching process severely damages semiconductor material adjacent the etched areas which further reduces life, operating characteristics, and reliability. Also, etching processes are very time consuming and difficult to perform.

In addition to the etching problems, all known prior art fabrication processes require many interspersed growing, masking and etching steps which greatly complicate and lengthen the process. For example, when epitaxial layers are grown, the wafers must be placed in a vacuum or pressure chamber to provide the atmosphere for the growth. Each time the wafer must be etched and/or masked, it must be removed from the chamber, resulting in large amounts of preparation time for each step. Also, each time wafers are removed from a chamber and subsequently replaced, the opening and preparation of the chamber (as well as the processing of the wafer) is an opportunity for additional impurities and contaminants to be introduced to the wafer.

Accordingly, it would be highly desirable to provide fabrication methods for semiconductor devices which do not require etching and/or placing wafers in a processing chamber and removing them several times in sequence.

It is a purpose of the present invention to provide a new and improved method of fabricating semiconductor devices.

It is another purpose of the present invention to provide a new and improved method of fabricating semiconductor devices which does not require etching the semiconductor material to form devices.

It is still another purpose of the present invention to provide a new and improved method of fabricating semiconductor devices which does not require the introduction and removal of wafers from processing chambers several times in sequence.

It is a further purpose of the present invention to provide a new and improved method of fabricating semiconductor devices which is much simpler and includes less chance of contamination of the devices.

It is a still further purpose of the present invention to provide new and improved semiconductor devices which lend themselves to further integration, and include characteristics that are not achieved by standard processes.

SUMMARY OF THE INVENTION

The above problems and others are at least partially solved and the above purposes and others are realized in a method of fabricating semiconductor devices including defining an area on the surface of a substrate, selectively growing, on the area, a crystalline material with at least one defined crystallographic facet, and selectively growing a semiconductor device on the crystallographic facet. The above purposes are further realized in a second embodiment wherein an area is defined on the surface of a substrate and chemical beam epitaxy is used to selectively grow, on the area, a layer of indium arsenide with at least one defined crystallographic facet.

BRIEF DESCRIPTION OF THE DRAWINGS

Referring to the drawings.

DESCRIPTION OF THE PREFERRED EMBODIMENTS

Figure 1:
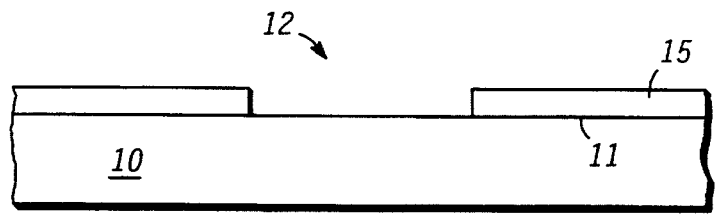
FIG. 1 is a simplified sectional view of a substrate with a growth area defined on the surface thereof.
Figure 2:
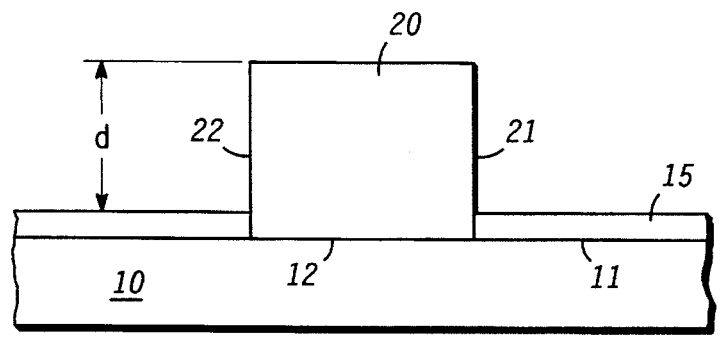
FIG. 2 is a simplified sectional view of the substrate of FIG. 1 with crystalline material selectively grown on the surface.
Figure 3:
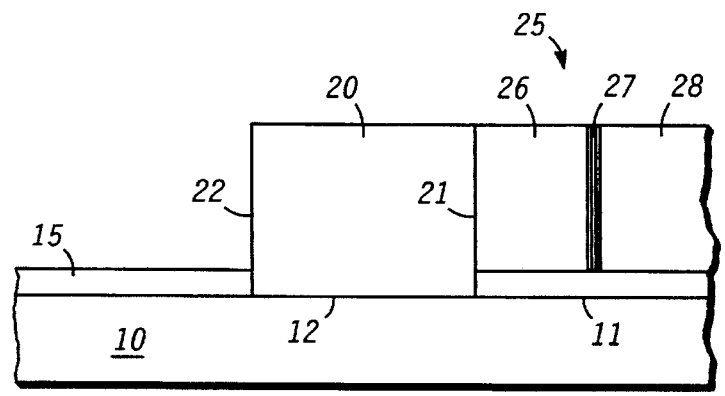
FIG. 3 is a simplified sectional view of a semiconductor device grown on the crystalline material of FIG. 2.

Turning now to the drawings, FIGS. 1–3 illustrate several steps in a method of fabricating semiconductor devices in accordance with the present invention. Referring specifically to FIG. 1, a simplified sectional view of a substrate 10 having a planar surface 11 is illustrated. In this specific embodiment, substrate 10 is formed of gallium arsenide (GaAs), but it will be understood by those skilled in the art that other materials known in the art might be utilized. An area 12 is defined on surface 11 by means of a mask 15 or the like formed from a layer of insulating material, such as silicon nitride, other nitrides or oxides, etc. It will of course be understood that substrate 10 will generally be a semiconductor wafer and a large number of areas 12 will be formed thereon simultaneously. Mask 15 can be formed, for example, by utilizing the usual photoresist processes. Generally this includes laying down a blanket layer and etching desired areas 12. Since the etch occurs before any growth or other operations it will not contaminate or otherwise effect the final product.

With mask 15 in place, a predetermined amount of crystalline material 20 is selectively grown in area (or areas) 12. For purposes of this disclosure, "selective growth" or "selectively grown" is defined as growing only in the specific or designated area. Thus, in this example, material 20 grows only in area 12. Further, material 20 grows in a crystalline form so that growth rates and shapes are crystallographic dependent, i.e. the rate and shape of growth are dependent upon the type of material 20 being utilized. In the embodiment illustrated in FIG. 2, material 20 could be a crystallographic structure with sides 21 and 22 which are smooth crystallographic facets or it could be a layer in which growth was controlled to a depth "d" to provide sides 21 and 22. In this embodiment, material 20 includes a crystalline material such as GaAs, InAs, or the like.

Here it should be noted that the growth of material 20 can be controlled very accurately so that the dimension d of sides 21 and/or 22 can be very accurately controlled. Also, because the size and shape of sides 21 and/or 22 are determined by the growth rate and crystallographic structure of material 20, dimension d can be made very small. In fact, by utilizing sides 21 and/or 22 the surface can be made much smaller and more precise than is practical by prior art methods of forming an upwardly directed surface by blanket growth and etching.

A semiconductor device 25 is then selectively grown on surface 21 (and/or surface 22). While many different types of semiconductor devices may be grown on surface 21, in this embodiment and for illustration only, a resonant interband tunneling diode (RITD) is illustrated. Device 25 includes a first semiconductor layer 26, an active area 27 and a second semiconductor layer 28. It should be specifically noted that material 20, layer 26, active area 27 and layer 28 can all be grown in a processing chamber without removing substrate 10 from the chamber. Also, this technique enables further in-situ processing of more complicated devices and structures without having to process ex-situ (i.e. etching and the like) and reintroduction into the processing chamber for subsequent growth.

Figure 4:
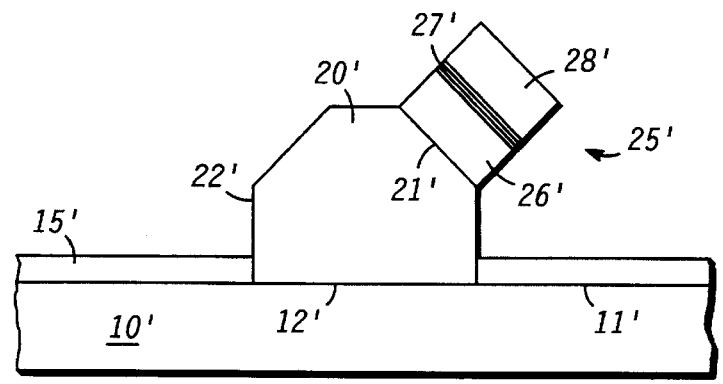
FIG. 4 is a simplified sectional view of a substrate similar to the substrate of FIG. 1 with a different crystalline material selectively grown on the surface.

Referring to FIG. 4, a second embodiment is illustrated in which various components which are similar to components in FIG. 3 are designated with similar numerals and a prime is added to indicate a different embodiment. In this embodiment a crystalline material 20' is grown in an area 12' on the surface 11' of substrate 10' as described above. Crystalline material 20' is chosen to provide smooth crystallographic facets 21' and 22' of a desired shape and size. It has been found that with the proper selection of material and orientation of the growth, specific facets, such as (101), (311) etc., can be grown in a desired orientation and size.

A semiconductor device 25' is then selectively grown, in-situ, on one or more of the facets. Because the selected facets or sides of the crystalline material are accurately grown to a predetermined size, selective growth of semiconductor devices on the facets or sides determines the size of the semiconductor device and patterning or etching are not required. External connections, etc. are not illustrated since they will depend upon the device or devices being fabricated and the integration into a complete circuit. However, it will be understood by those skilled in the art that metallization can be easily performed in the usual manner once the entire structures are selectively grown. Thus, the selective growth capability results in devices with characteristics that are suitable for subsequent device integration.

Figure 5:
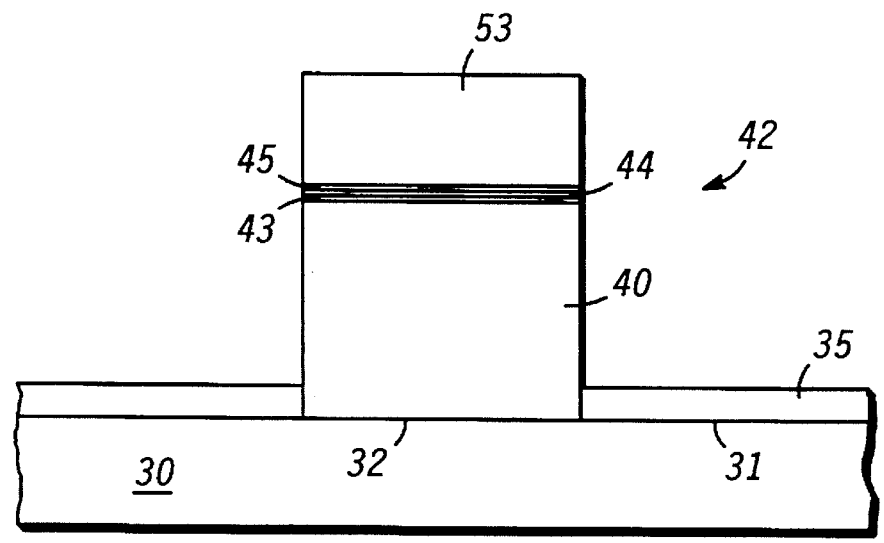
FIG. 5 is a simplified sectional view of a substrate similar to the substrate of FIG. 1 with an indium arsenide semiconductor device selectively grown on the surface.

Referring now to FIG. 5, another structure is illustrated which is fabricated in accordance with a somewhat different method. As described above, a substrate 30, composed of GaAs or the like, is provided having a surface 31. An area 32 is defined on surface 31 by means of a mask 35 or the like formed from a layer of insulating material, such as silicon nitride, other nitrides or oxides, etc. Using chemical beam epitaxy, a layer 40 of indium arsenide is selectively grown on surface 31 of substrate 30 in area 32. As an example, it has been found that selective growth of indium arsenide is achieved by using trimethylindium and arsine ($AsH_3$) in a pressure chamber, for a trimethylindium arrival rate of 0.6 ML/s at an overpressure in the range of approximately 1.4 ML/s to 2.0 ML/s and a temperature in the range of approximately 500° C. to 515° C. at the growth area on the surface of the substrate. For purposes of this disclosure, the term "ML/s" is defined as monolayers per second, and is used as a measure of the arrival rate of molecules at the surface.

Figure 6:
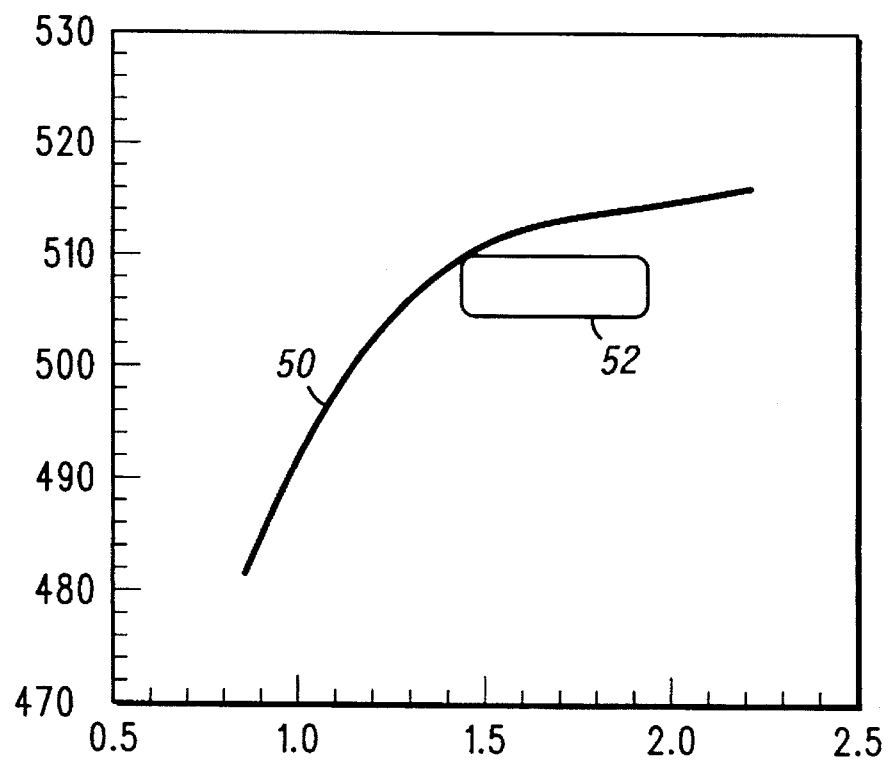
FIG. 6 is a graphic representation of growth conditions for indium arsenide.

Referring to FIG. 6, a graphical representation of indium arsenide growth by chemical beam epitaxy from trimethylindium and arsine is illustrated. Numbers measured along the X-axis represent arsenic (As) overpressure (arrival in ML/s) and the numbers along the Y-axis represent temperature (in Centigrade) at the growth area, e.g. the surface of the substrate. A curve 50 is illustrated on the graph to represent indium arsenide growth, with the area under curve 50 including all of the conditions under which indium arsenide will grow. A growth window 52 is illustrated and indicates the conditions under which indium arsenide can be selectively grown utilizing chemical beam epitaxy.

Referring again to FIG. 5, once layer 40 of indium arsenide is grown to the desired width, in this embodiment approximately one micron (1 μm), an active area 42 is formed. Generally, (assuming a resonant interband tunneling diode is being fabricated) active area 42 includes a first barrier layer 43, a quantum well layer 44 and a second barrier layer 45 formed of antimonide material (e.g. aluminum antimonide). Because active area 42 is very narrow (approximately 50 to 100 angstroms), it is not necessary (although it is still desirable) to selectively deposit the antimonide material. A final layer 53 of indium arsenide is then grown on active area 42.

When the antimonide material is grown non-selectively a small amount of indium arsenide will be deposited non-selectively as a result of the non-selective deposition of active area 42, the antimonide acting as nucleation sites. However, the small amount of polycrystalline material that is deposited is easily etched away by a blanket indium arsenide etch after the semiconductor device is completed. In this instance the semiconductor device is completed insitu and the blanket etch is not used to define any of the critical areas or dimensions and, therefore, does not contaminate or damage any of the devices.

Thus, new and improved methods for fabricating semiconductor devices are disclosed which do not require etching and/or placing wafers in a processing chamber and removing them several times in sequence. Further, because the improved methods of fabricating semiconductor devices does not require etching the semiconductor material to form devices the process is much simpler to perform and includes less chance of contamination of the devices. Also, because the size of the semiconductor devices is dictated by selective growth rather than patterning and etching, new and improved semiconductor devices which lend themselves to further integration can be fabricated. The new and improved semiconductor devices also include characteristics that can not be achieved by standard processes.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of fabricating semiconductor devices comprising the steps of:

providing a substrate with a planar surface;

defining an area on the surface of the substrate;

selectively growing, on the area, a crystalline material with at least one defined crystallographic facet, the crystalline material being selected and grown so that the crystallographic facet is positioned at an angle other than zero to the substrate; and selectively growing a semiconductor device on the crystallographic facet.

2. A method of fabricating semiconductor devices as claimed in claim 1 wherein the step of selectively growing the crystalline material includes selectively growing indium arsenide.

3. A method of fabricating semiconductor devices as claimed in claim 2 wherein the step of selectively growing the indium arsenide includes using chemical beam epitaxy to grow the indium arsenide.

4. A method of fabricating semiconductor devices as claimed in claim 3 wherein the step of using chemical beam epitaxy to grow the indium arsenide includes growing the indium arsenide at a temperature in the range of approximately 500° C. to 515° C. at the area on the surface of the substrate.

5. A method of fabricating semiconductor devices as claimed in claim 4 wherein the step of using chemical beam epitaxy to grow the indium arsenide includes growing the indium arsenide in a pressure chamber at an overpressure in the range of approximately 1.4 ML/s to 2.0 ML/s.

6. A method of fabricating semiconductor devices as claimed in claim 5 wherein the step of using chemical beam epitaxy to grow the indium arsenide includes using trimethylindium and arsine.

7. A method of fabricating semiconductor devices as claimed in claim 1 wherein the step of selectively growing the semiconductor device includes the steps of selectively growing a first layer of semiconductor material on the crystallographic facet, growing an active layer on the first layer of semiconductor material, and selectively growing a second layer of semiconductor material on the active layer.

8. A method of fabricating semiconductor devices as claimed in claim 7 wherein the step of selectively growing the first layer of semiconductor material includes selectively growing a layer of indium arsenide.

9. A method of fabricating semiconductor devices as claimed in claim 8 wherein the step of growing an active layer includes growing a thin layer of an antimonide material.

10. A method of fabricating semiconductor devices as claimed in claim 9 wherein the step of selectively growing a second layer of semiconductor material includes selectively growing a layer of indium arsenide.

11. A method of fabricating semiconductor devices as claimed in claim 1 wherein the step of selectively growing the crystalline material with at least one crystallographic facet includes growing the crystalline material until the at least one facet has a selected dimension in at least one direction.

12. A method of fabricating semiconductor devices as claimed in claim 11 wherein the step of selectively growing the crystalline material until the at least one facet has a selected dimension in at least one direction includes selectively growing a layer of crystalline material with sidewalls having a specific width and the step of selectively growing a semiconductor device includes selectively growing a layer of semiconductor material on one sidewall having a specific width.

13. A method of fabricating semiconductor devices as claimed in claim 1 wherein the step of defining an area on the surface of the substrate includes forming a mask of insulating material.

14. A method of fabricating semiconductor devices as claimed in claim 13 wherein the step of forming a mask of insulating material includes forming a mask of nitride material.

15. A method of fabricating semiconductor devices comprising the steps of:

providing a crystalline semiconductor substrate with a planar surface;

defining an area on the surface of the substrate;

selectively epitaxially growing, on the area using a metalorganic compound, a crystalline material with a selected crystallographic surface having a specific dimension determined by a growth rate and crystallographic structure of the crystalline material; and selectively growing a semiconductor device on the selected surface.

16. A method of fabricating semiconductor devices as claimed in claim 15 wherein the step of selectively epitaxially growing the crystalline material with a selected crystallographic surface having a specific dimension includes selectively growing a layer of crystalline material with a specific thickness measured from the surface of the substrate to a surface of the crystalline material substantially parallel to the surface of the substrate and the step of selectively growing a semiconductor device includes selectively growing a layer of semiconductor material on a side of the layer of crystalline material substantially perpendicular to the specific thickness.

17. A method of fabricating semiconductor devices as claimed in claim 15 wherein the steps of selectively growing the crystalline material and selectively growing a semiconductor device are performed sequentially in a pressure chamber using chemical beam epitaxy without removing the substrate from the chamber.

18. A method of fabricating semiconductor devices comprising the steps of:

providing a substrate with a planar surface;

defining an area on the surface of the substrate; and using chemical beam epitaxy and a metalorganic compound, selectively growing, on the area, a layer of indium arsenide at a temperature in the range of approximately 500° C. to 515° C. at the area on the surface of the substrate.

19. A method of fabricating semiconductor devices as claimed in claim 18, the step of using chemical beam epitaxy to grow the indium arsenide further including growing the indium arsenide in a pressure chamber at an overpressure in the range of approximately 1.4 ML/s to 2.0 ML/s.

20. A method of fabricating semiconductor devices as claimed in claim 19, the step of using chemical beam epitaxy to grow the indium arsenide further including using trimethylindium and arsine.

\* \* \* \* \*